United States Patent [19]

Furutani

[11] Patent Number: 4,939,733
[45] Date of Patent: Jul. 3, 1990

[54] SYNDROME GENERATOR FOR HAMMING CODE AND METHOD FOR GENERATING SYNDROME FOR HAMMING CODE

[75] Inventor: Kiyohiro Furutani, Hyogo, Japan

[73] Assignee: Mitsubishi Denki Kabushiki Kaisha, Tokyo, Japan

[21] Appl. No.: 247,293

[22] Filed: Sep. 22, 1988

[30] Foreign Application Priority Data

Sep. 24, 1987 [JP] Japan .................. 62-241824

[51] Int. Cl.$^5$ .............................................. G06F 11/10
[52] U.S. Cl. .................................... 371/40.1; 371/37.1
[58] Field of Search ................ 371/37.1, 38.1, 39.1, 371/40.1

[56] References Cited

U.S. PATENT DOCUMENTS 4,694,455  9/1987  Koga ................................ 371/37.1
4,713,816 12/1987  Van Gils ........................... 371/40.1
4,716,566 12/1987  Masuhara et al. ................. 371/37.7

Primary Examiner—Charles E. Atkinson
Attorney, Agent, or Firm—Lowe, Price, LeBlanc, Becker & Shur

[57] ABSTRACT

The syndrome for a Hamming code word is generated by a generator formed based on a parity check matrix where column vectors are non-zero and differ from column to column. The parity check matrix is obtained by arranging a plurality of column vector pairs each comprising two column vectors one of which is obtained by inverting all the bit values of the elements of the other to provide a dot product of zero.

6 Claims, 5 Drawing Sheets

SYNDROME GENERATOR FOR HAMMING CODE AND METHOD FOR GENERATING SYNDROME FOR HAMMING CODE

BACKGROUND OF THE INVENTION

1. Field of the Invention

This invention relates to a syndrome generator for detecting and correcting errors in Hamming code, and a method for generating the syndrome for Hamming code. More particularly, this invention relates to the circuit arrangement for a parity check matrix to be used in generating the syndrome for Hamming code, and a method for generating the same.

2. Description of the Prior Art

A recent development in data processing technology has made possible a high speed processing of huge amounts of information. In such information process, there is a possibility that the data to be processed contain an error or errors. Thus, it is necessary for the errors in the data to be detected and corrected before the data go through data processing operations. For this purpose, different codes are used in this field of technology which provide a function to detect and correct errors in the data. Among them is the code named Hamming code. The error-detection and correction in Hamming code is now briefly described.

The following linear simultaneous equation is considered:

$$\left.\begin{array}{c} a_{11}x_1 + a_{12}x_2 + \ldots + a_{1n}x_n = 0 \\ a_{21}x_1 + a_{22}x_2 + \ldots + a_{2n}x_n = 0 \\ \vdots \\ a_{m1}x_1 + a_{m2}x_2 + \ldots + a_{mn}x_n = 0 \end{array}\right\} \text{(mod. 2)} \quad (1)$$

where $n > m$, $x_i \in \{0, 1\}$, and product and addition should be performed following the rules of Boolean algebra.

The equation (1) can be expressed in matrix as follows:

$$\begin{pmatrix} a_{11}, a_{12}, \ldots a_{1n} \\ \vdots \\ a_{m1}, a_{m2}, \ldots a_{mn} \end{pmatrix} \begin{pmatrix} x_1 \\ x_2 \\ x_n \end{pmatrix} \quad (2)$$

$$= HX^T \text{ (mod. 2)}$$
$$= 0$$

where $X = (x_1, x_2 \ldots x_n)$ represents a row vector and T is a symbol representing transposition.

In the equation (1) or (2), if $(n-m) x_i$s are independently selected, then the value of the remaining $m x_i$s are uniquely determined. The $(n-m) x_i$s are called information bits, while $m x_i$s are designated check bits. When the above matrix H for parity check is expressed as follows, it is called a canonical parity check matrix:

$$H = m \begin{matrix} m & k \\ [I_m \, P] \end{matrix} \quad (3)$$

Where $m + k = n$, and Im designates a unit matrix of m rows and m columns. In this case, the check bits comprise the first m bits $(x_1, x_2 \ldots x_m)$, and from the equation $HX^T = 0$ (mod. 2), $$\begin{pmatrix} x_1 \\ \vdots \\ x_m \end{pmatrix} = P \begin{pmatrix} x_{m+1} \\ \vdots \\ x_n \end{pmatrix} \text{(mod. 2)} \quad (4)$$

Thus, the check bits can be produced from information bits.

On the other hand, the following equation is considered in connection with the equation (3):

$$G = k \begin{matrix} m & k \\ [P^T I_k] \end{matrix} \quad (5)$$

The code word X is divided into information bits $x_I$ and the check bits $x_C$:

$$X = (x_C x_I).$$

Then, the code word X is generated as follows:

$$X = x_I G \text{ (mod. 2)} \quad (6)$$

The matrix G is called a generating matrix.

Now, the following equation is considered.

$$S = HY^T \quad (7)$$

When $\vec{S} = O$, then $Y \in \{X\}$, and if $\vec{S} \neq \vec{0}$, then $Y \{X\}$. Note that $\{X\}$ represents a set of code words X, or a code. Thus, by checking the value of S, it can be determined whether an applied code word Y contains an error. S is called a syndrome. If an applied code word Y includes a single error pattern $$e_i = (0, \ldots 0, 1, 0 \ldots 0),$$
$$\phantom{e_i = (0, \ldots 0, } i$$

its syndrome S is given as $$S = H(x + e_i)^T = He_i^T \quad (8)$$

Note that the syndrome S is identical to the vector of the i-th column in the parity check matrix.

From the above discussion, it can be seen that if each column in the parity check matrix H is represented by a vector other than zero vector and is different from each other, it is possible, by means of the syndrome S, to detect an error location in the code word Y, as well as to correct the error bit. The code produced by the generating matrix $G = [P^T, I_k]$ corresponding to the matrix $H = [I_m, P]$, which satisfies the above conditions, is designated Hamming code. Hamming code is in common use in the field of information processing as the code for single error correction. In order to correct an error, the syndrome for a supplied data is first obtained, and a single error pattern corresponding to the obtained syndrome is then added to the supplied data.

Correction of the data stored in semiconductor memory devices is one application where Hamming code is used to advantage, and such application is now specifically described. In recent computers ranging from mainframe computers to minicomputers, the greater the capacity for the main or primary storage unit involved, the larger the number of faulty storage elements or memory cells in the primary storage unit. Now it has been a general practice to accommodate in the primary storage unit a code for detecting and correcting errors in the data stored therein. For this data correction purpose, the above described Hamming code is utilized. The organization of a conventionally used syndrome generator is now described.

For the convenience of simplicity, a Hamming (21, 5) code is considered which comprises 5 check bits and 16 information bits. With this code, the parity check matrix H is represented as follows, for example:

$$H = \begin{pmatrix} 101010101010101010101 \\ 011001100110011001100 \\ 000111100001111000011 \\ 000000011111111000000 \\ 000000000000000111111 \end{pmatrix} \quad (8)$$

In the above check matrix H, the binary numbers are arranged in a progressively increasing order from the first column to the 21st column. It is assumed that the first row constitutes the least significant bit (LSB), and the fifth row the most significant bit (MSB). Then, if the $2^i$-th columns (where i=0-4) are taken out from the matrix H to form a matrix, the resultant matrix of five columns and five rows comprises a unit matrix. Hence, in the Hamming code $X=(x_1, x_2 \ldots x_{21})$ for the above stated parity check matrix H, the parity check bits $x_C$ are given by $(x_1, x_2, x_4, x_8, x_{16})$ from the following equation which has been explained hereinabove.

$$S=HX^T=(S_0, SY_1, SY_2, SY_3, SY_4)^T=0$$

Where $SY_i$ (i=0-4) represents an element in the syndrome S and is expressed as follows.

$$SY_0 = x_1 \oplus x_3 \oplus x_5 \oplus x_7 \oplus x_9 \oplus x_{11} \oplus x_{13} \oplus x_{15} \oplus x_{17} \oplus x_{19} \oplus x_{21} \quad (9)$$

$$SY_1 = x_2 \oplus x_3 \oplus x_6 \oplus x_7 \oplus x_{10} \oplus x_{11} \oplus x_{14} \oplus x_{15} \oplus x_{18} \oplus x_{19} \quad (10)$$

$$SY_2 = x_4 \oplus x_5 \oplus x_6 \oplus x_7 \oplus x_{12} \oplus x_{13} \oplus x_{14} \oplus x_{15} \oplus x_{20} \oplus x_{21} \quad (11)$$

$$SY_3 = x_8 \oplus x_9 \oplus x_{10} \oplus x_{11} \oplus x_{12} \oplus x_{13} \oplus x_{14} \oplus x_{15} \quad (12)$$

$$SY_4 = x_{16} \oplus x_{17} \oplus x_{18} \oplus x_{19} \oplus x_{20} \oplus x_{21} \quad (13)$$

It is pointed out here that the matrix H in the expression (8) is neither [P, $I_k$] nor [$I_k P^T$] in the form. However, as for the matrix H for generating the Hamming code, any matrix may be employed as far as the vector in each column is non-zero and is different from column to column in the matrix and further the matrix is equivalent to $H_o=[PI_k]$. Locations for the parity check bits may suitably be selected depending on the configuration of the parity check matrix.

In FIG. 1, there is illustrated the arrangement of a typical prior-art syndrome generator for generating a syndrome S in accordance with the matrix H given by the expression (8).

Referring to FIG. 1, the illustrated syndrome generator functions in accordance with the above mentioned equations (9)–(13) to provide a syndrome S, and includes a data selector 3' and an operational block 15. The data selector 3' operates in response to select signals $S_0$–$S_4$ to select the desired data from the data in the memory cells 21-1 to 21-21 on a selected row in the cell array 1. The memory cells 21-1, 21-2, 21-4, 21-8 and 21-16 store parity check bit data, while the remaining memory cells store information bit data. The operational block 15 executes the addition of the modulus 2 on the output from the data selector 3', i.e., it performs an exclusive OR operation. Specifically, the data selector 3' comprises a plurality of switching devices $4_{11}$–$4_{215}$ (n-channel MOS transistors in the illustrated example) which are arranged in a matrix of 21 rows and 5 columns. The five columns of the switching devices $4_{11}$–$4_{215}$ are supplied with select signals $S_0$, $S_1$, $S_2$, $S_3$ and $S_4$, respectively, and the switching devices in each columns are driven into conduction when the select signal applied thereto is at an active or high level state. Each of the switching devices $4_{11}$–$4_{215}$, when rendered conductive, delivers either the data stored in a memory cell or the "0" data depending on whether it is connected with the memory cells in the array 1 or the ground. It is noted here that the switching devices are interconnected with the memory cells and the ground so as to satisfy the equations (9)–(13). Thus, the select signals $S_0$–$S_4$ direct operational performance as represented by the elements $SY_0$–$SY_4$ of the syndrome S, respectively. As the select signal $S_0$ is brought into an active state, the switching devices in the associated column in the data selector 3' function to select the memory cells in the cell array necessary for the execution of the equation (9). Similarly, in response to an active select signal $S_1$, the associated column of switching devices operates to select the memory cells out of the cell array 1 required for the execution of the equation (10). The same is the case with the other selected signals $S_2$–$S_4$.

The operational block 15 includes a plurality of exclusive OR circuits 15-1 to 15-21 which are provided corresponding to the rows of switching devices in the data selector 3', and are coupled to one another in a cascade connection. With this arrangement, each of the exclusive OR circuits 15-1 to 15-21 is supplied both with the output from its associated row of the data selector 3' and with the output from a preceding exclusive OR circuit. Upon receipt of the two outputs, each exclusive OR circuit feeds an exclusively OR-ed output to the next exclusive OR circuit. In this manner of operation, the final exclusive OR circuit 15-21 provides the element $SY_i$(i=0-4) of the syndrome S as its output.

The element $SY_i$ in syndrome $S=HX^T=(SY_i)$ (i=0-4) is obtained by driving the select signal Si successively to the active "high" level.

Now, it is assumed that memory cells 21-1 to 21-21 on a selected row in the cell array 1 contain check bits $x_1$, $x_2$, $x_4$, $x_8$ and $x_{16}$ as determined by the data in the information bits. When the data $X=(x_1 \ldots x_{21})$ are read out from memory cells on the selected row, followed by sequentially activating the select signals $S_0$–$S_4$, individual element $SY_i$ of the syndrome S with respect to the data X is obtained. If the read out data in the information bits contain no error, then each element $SY_i$ of the syndrome S is zero ($S=HX^T=0$). On the other hand, if only the information bit $x_i$ in the data x is in error, then the generated syndrome S is equal to the i-th column in the check matrix H. Since the column vector in the check matrix H differs from column to column, it is feasible to locate the erroneous information bit and also to correct the data error. For example, if $S = HX^T = (1, 0, 1, 0, 0)^T$, it can be seen from the expression (8) that the information bit $x_5$ is incorrect. Then, the correction of the data is carried out by inverting the information bit $x_5$, i.e. by adding the error pattern $$(0, \ldots \underset{5}{1}, 0, \ldots 0)$$

vectorially to the read-out data.

As has been described, the prior-art syndrome generator is designed to produce a syndrome in accordance with the equations (9)–(13) using the check matrix represented by the expression (8) where 1-digit binary numbers other than the binary number 0 are arranged in a progressively increasing or decreasing order. This type of prior-art syndrome generator possesses several distinct disadvantages. For example, the syndrome generation based on the equations (9)–(13) makes it necessary to provide one separate exclusive OR circuit for every selected memory cell (or every code bit storage cell) as shown in FIG. 1. Phrased differently, the exclusive OR circuit must be provided at the same pitch as one pitch A of a memory cell, wherein the term "pitch" refers to the frequency of occurence of the cells or circuit elements along the substrate. As the memory cell area reduces with an ever-growing storage capacity of the memory device, the pitch requirement for the exclusive OR circuit gets more severe, making it increasingly difficult for the exclusive OR circuit to be formed within the same pitch as that of the memory cell. This constitutes a great impeding factor against a highly integrated memory device.

As is well known to those skilled in the art, large-scale integrated circuits or LSIs are also used for error correction in the area of data processing. In such application, too, a larger code length gives rise to similar problems.

Another disadvantage of the conventional syndrome generator is that it includes a large number of transistor devices arranged in rows and columns with complicated interconnections among them.

SUMMARY OF THE INVENTION

It is an object of this invention to provide a novel syndrome generator which is open to high-level integration and is suitable for use with high density devices.

It is another object of this invention to provide a novel syndrome generator which is simple in construction and requires a smaller number of component parts.

It is still another object of this invention to provide a simple method for generating a syndrome.

A syndrome generator according to this invention makes use of a matrix comprising plural pairs of column vectors (whose dot product is 0) as a parity check matrix H for the Hamming code.

According to the syndrome generator of the invention, the k-th vector (where k is an odd number) and the (k+1)-th vector are combined into a pair or set, and their dot product is zero. This means that, in one pair of column vectors, the elements in the same row are not "1" at the same time, that is, if the one is "0", the other is "1". Phrased differently, in calculating each of the elements of a syndrome S, there is no possibility that the two memory cells associated with one pair of column vectors are not used simultaneously. This permits a simpler arrangement of only one exclusive OR circuit for two memory cells. In other words, it is sufficient that one exclusive OR circuit is provided for two pitches of memory cells, considerably relaxing pitch conditions on the exclusive OR circuits. This simple circuit design also requires a smaller number of transistor devices.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a schematic illustration showing the generation of the parity check matrix according to this invention;

DESCRIPTION OF THE PREFERRED EMBODIMENTS

Figure 1:
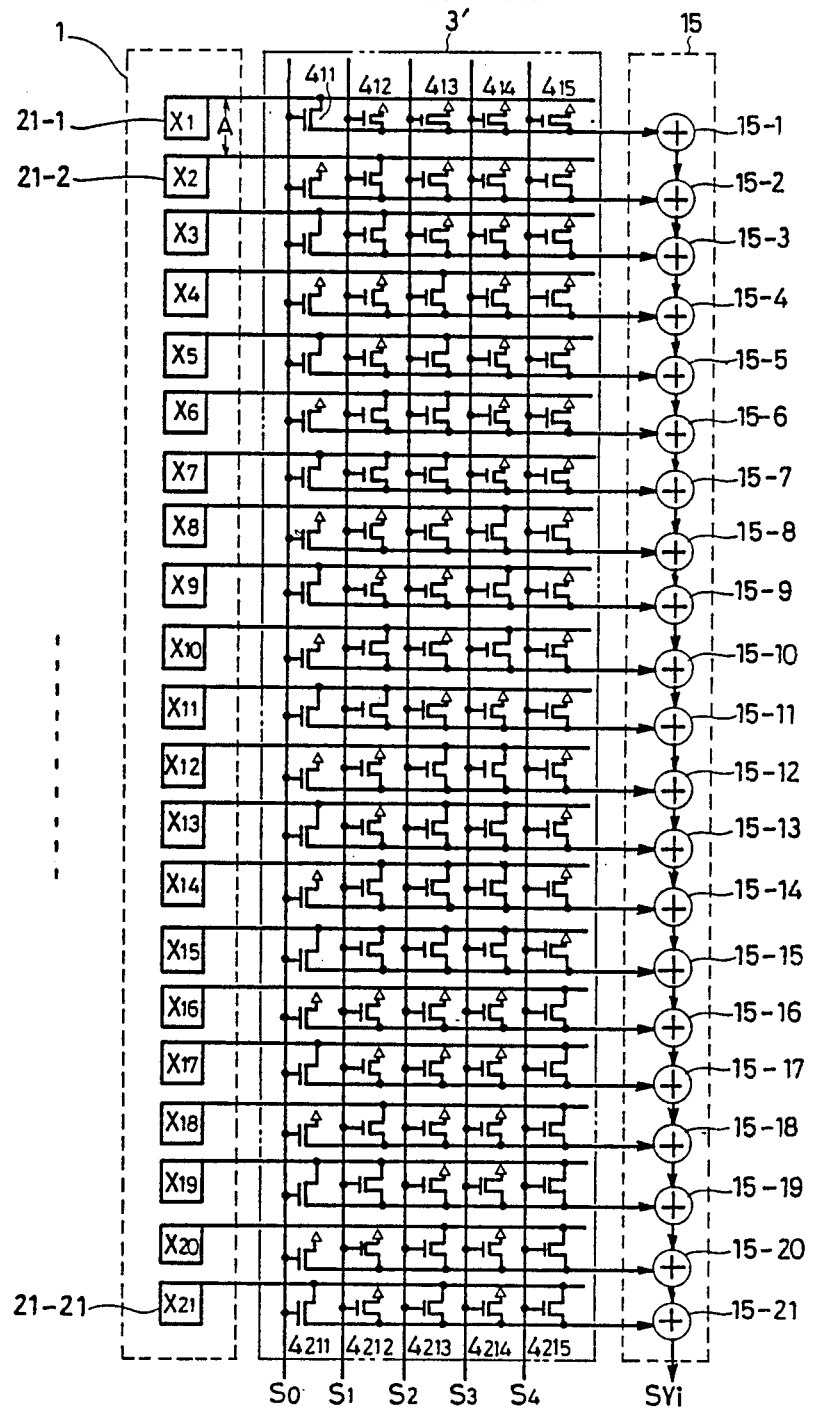
FIG. 1 is a schematic illustration showing an overall arrangement of a prior-art syndrome generator.
Figure 2:
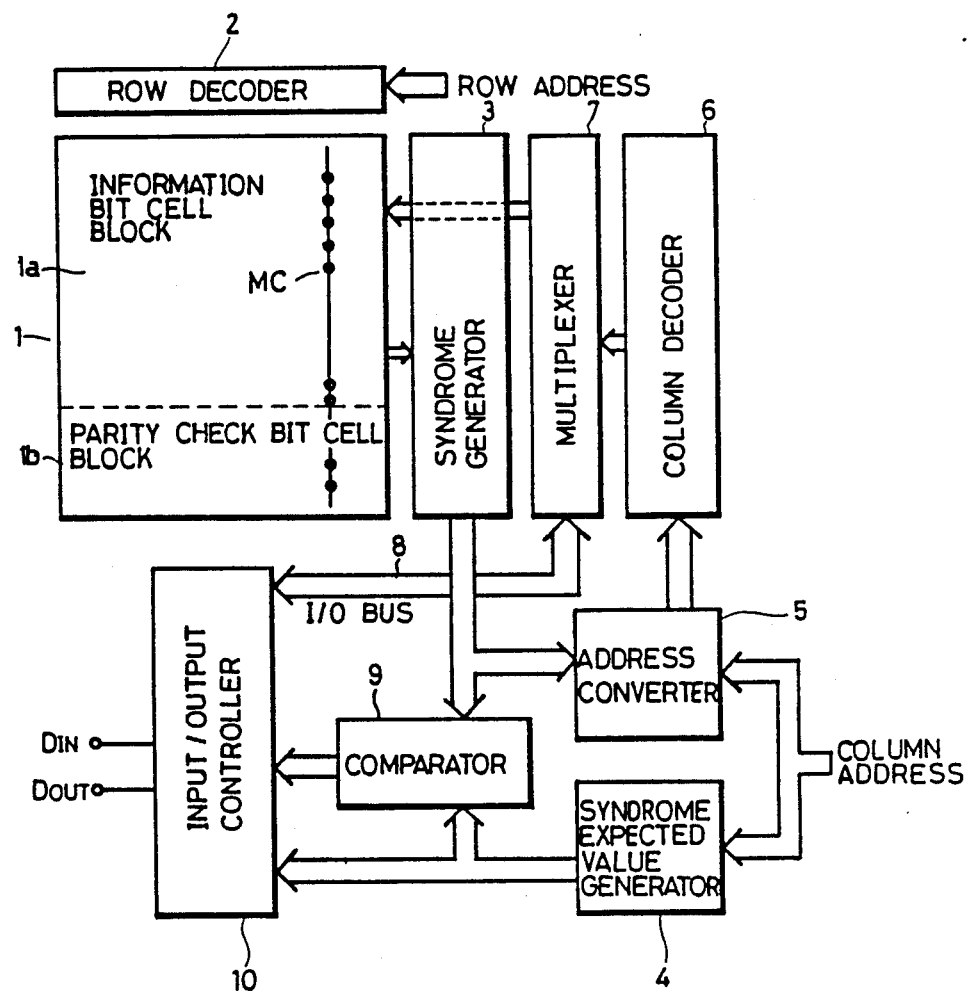
FIG. 2 is a block diagram showing an overall arrangement of a semiconductor memory device having an error correction function to which the present invention applies.

First, for clear understanding of the present invention a semiconductor memory device used as a main storage unit to which the syndrome generator of the present invention is applied is briefly discussed in terms of the overall configuration and the operation, with reference to FIG. 2.

The memory device shown in FIG. 2 is discussed in the Japanese Patent Application JPA63-055253 (Japanese patent application serial number 55253/1988) and JPA63-064234 (Japanese patent application serial number 64234/1988) both entitled "Semiconductor Memory Device" and filed Mar. 8, 1988 and Mar. 16, 1988, respectively by the same inventor and assigned to the same assignee of the present application, Mitsubishi Denki Kabushiki Kaisha.

Referring to FIG. 2, the main storage unit includes a memory cell array 1 comprising a cell block 1a for information bits, and another cell block 1b for parity check bits. The cell block 1a is for storing data to be read and written, while the cell block 1b is for storing parity check bits to be used for correcting the data in the memory cells of the cell block 1a. Each of the cell blocks 1a and 1b contains a plurality of memory cells arranged in a matrix of rows and columns. A single code word is made up of the data on one row of memory cells in the blocks 1a and 1b. The data to be written into the parity check bit cells are determined depending on the data to be stored in the same row of information bit cells.

A row decoder 2 is provided to select one row in the memory cell array 1 in accordance with an externally applied row address.

A syndrome generator 3 functions to generate a syndrome based on the data (including information bits as well as parity bit) stored in the memory cells on a selected row according to a predetermined matrix H. The generated syndrome is fed to a comparator 9 and an address converter 5.

A syndrome expected value generator 4 decodes a column address externally applied thereto, and supplies to the comparator 9 and an input/output controller 10 a syndrome expected value (or a corresponding column vector in the matrix H) which corresponds to a syndrome to be generated when data bit on the selected column is erroneous.

An address converter 5 is provided to pre-decode a column address applied externally or a syndrome supplied from the syndrome generator 3, and feeds the pre-decoded column address or syndrome to a column decoder 6. More specifically, in a data write/read cycle of operation, the address converter 5 functions to pre-decode an externally fed column address into a column select signal, which is supplied to the column decoder 6. On the other hand, in a data correction cycle, the address converter 5 works to pre-decode a syndrome from the syndrome generator 3 and generate a column select signal which is indicative of an error bit position with respect to the column.

Upon receipt of the pre-decoded column select signal from the address converter 5, the column decoder 6 decodes the received signal into an output signal for selecting one column of memory cells in the cell block 1a (: including parity check bits in the cell block 1b where necessary). The column select output from the column decoder 6 is supplied to a multiplexer 7, which in turn operates to connect a selected column or columns in the memory cell array 1 to an I/O bus 8.

The comparator 9 compares the syndrome from the syndrome generator 3 and the expected syndrome from the syndrome expected value generator 4, and delivers an output signal representing the compared result to the I/O controller 10.

The I/O controller 10 operates in response to the output signal from the comparator 9 to perform a desired correction on the incorrect data, and provides the corrected data as an output. The I/O controller 10 also operates to correct the parity check bits in accordance with the expected syndrome from the syndrome expected value generator 4.

The operation of the illustrated main storage unit is next explained.

(i) Data Read-Out Cycle

Upon receiving a new address, the row decoder 2 operates to decode the applied row address and select one row in the memory cell array 1. Through this row selection, the whole data (including information bits and parity check bits stored in the selected row of memory cells in the cell array 1 are latched within the memory cell array 1. As the syndrome generator 3 is supplied with the latched data of the selected row of memory cells, it generates a syndrome S based on the predetermined parity check matrix H. On the other hand, a column address is fed to the address converter 5 and the syndrome expected value generator 4. The address converter 5 pre-decodes the applied column address and sends it out to the column decoder 6. The column decoder 6 decodes the received pre-decoded column address and supplies to the multiplexer 7 an output signal for selecting one column of the memory cell array 1. The multiplexer 7 operates in response to the column select signal to read out the data stored in the column of memory cells designated by the column address, and transfers the selected data onto the I/O bus 8.

Simultaneously with this process, the syndrome expected value generator 4 produces, in response to the externally applied column address, a syndrome to be generated in case the data in the column selected by the column address includes incorrect data, i.e., one column vector in the parity check matrix H. The comparator 9 verifies whether the two syndromes applied thereto are identical or not, and delivers an output signal representing the verified results to the I/O controller 10. If the comparator 9 indicates that the applied syndromes are identical, it means that the data read out of the memory cell is incorrect. In this instance, the I/O controller 10 first inverts the data read-out through the I/O bus 8 and then sends it out. On the other hand, if the output signal from the comparator 9 shows that the applied syndromes are not identical to each other, it follows that the data read out via the I/O bus 8 is correct. The I/O controller 10 then delivers the accepted data out as it is.

In the manner as stated, the single error correction function of the Hamming code makes sure that only correct data are read out all the time.

(ii) Data Writing Cycle

Before putting a memory chip or device into actual use, "0"s are written into all of the information bit cells and parity check bit cells in the memory chip or device. Thus, it is considered that the virgin memory device into which no data has been written by its user satisfies the condition expressed by $HX^T=0$.

When a row address for selecting a row of memory cells into which data are to be written is supplied to the row decoder 2, the desired row of memory cells in the cell array 1 is selected. Upon receiving the data from the selected row of memory cells, the syndrome generator 3 produces a syndrome. The address converter 5 operates to pre-decode a column address externally applied thereto and delivers the pre-decoded column address to the column decoder 6. The column decoder 6 in turn functions to select one column of information bit cells specified by the pre-decoded column address signal, and, at the same time, supplies to the multiplexer 7 an output signal for selecting all the parity check bit cells involved in the selected row. As a result, one bit of information bits and corresponding parity check bits are read out onto the I/O bus 8. As in the data read-out cycle of operation, the syndrome expected value generator 4 provides a syndrome to be generated in case the data in the column selected by the column address contains incorrect data. The comparator 9 determines whether a syndrome from the syndrome generator 3 and an expected syndrome from the syndrome expected value generator 4 are identical or not. The I/O controller 10 operates as follows in accordance with the output signal from the comparator 9 representing the compared result. For convenience of explanation, it is assumed here that $$H = \begin{matrix} & m & k \\ k & [H'I_k] \end{matrix},$$

$X=X_I+X_C$ where $X_I=(x_1, x_2 \ldots x_m)$ indicates the information bits and $X_C=(C_l \ldots C_k)$ denotes the parity check bits. Syndrome S is given as $S=H'X_I^T \oplus X_C^T$. Also, the expected syndrome E from the generator 4 with respect the information bits $x_i$ to be written is given as $E=(e_1, e_2 \ldots e_k)$.

(a) The case where comparator 9 generates an identical signal indicating the existing data $x_i'$ on the I/O bus 8 previously held in the selected memory cell is incorrect due to the presence of defective cell.

(1) If the existing data $x_i'$ is identical with the fresh data $x_i''$ to be written, then the I/O controller 10 alters the parity check bits $X_C$ on the I/O bus 8 to $X_C \oplus E$, at the same time, supplies the fresh data $x_i''(D_{IN})$ to be written onto the I/O bus 8. Consequently, the altered check bits $x_C \oplus E$ (where $\oplus$ represents the addition of modulus 2), and the new data $x_i''$ are written into the selected information memory cell.

(2) If the existing data $x_i'$ is not identical with the fresh data to be written, the existing data $x_i'$ on the I/O bus 8 is substituted by the new data $x_i''$. No exchange of the parity check bits takes place. Thus, only the writing of the new data $x_i''$ into the selected memory cell is carried out.

(b) The case where comparator 9 generates a nonidentical signal indicating the correct data $x_i'$ is read out and therefore the selected memory cell is normal.

(1) If the existing data $x_i'$ is not identical to the fresh data $x_C''$ ($D_{IN}$) to be written, the controller 10 alters the parity check bits $x_C$ on the I/O bus 8 to $x_C \oplus E$, and at the same time, delivers the new data $x_i''$ onto the I/O bus 8. As a consequence, the new data $x_i''$ is written into the selected data memory cells on one hand, and the modified parity check bits $x_C \oplus E$ are stored in the selected parity check bit cells on the other.

(2) If the existing data $x_i$ and a new data $x_i''$ to be written are identical with each other, then the new data $x_i''$ is transferred onto the I/O bus 8. No modification of the parity check bits occurs.

(iii) Correction Cycle

This is an operating cycle where a memory device corrects on its own the data it holds as follows.

A row address for the correction cycle is applied internally or externally to the row decoder 2 to select one row of memory cells in the memory cell array 1. The syndrome generator 3 then produces a syndrome based on the information data which are stored in the selected row, and supplies it to the address converter 5. In the correction cycle, no column address is externally applied. The address converter 5 in turn pre-decodes the supplied syndrome and generates a pre-decoded output signal indicating the column of memory cells wherein the data to be corrected is stored. If the syndrome is zero, it signifies that memory cells of the selected row contain only the correct data. Hence, the accessing for data correction on the selected row is finished, and the operation proceeds to the next cycle. The column decoder 6 decodes the pre-decoded signal, and supplies to the multiplexer 7 an output signal indicating the column containing an error bit. In responsive action, the multiplexer 7 transfers the data in the error bit onto the I/O bus 8. During the correction cycle, the I/O controller 10, in response to a non-zero syndrome S, inverts the data on the I/O bus 8 and writes the inverted data again into the selected memory cell (error bit cell) through the I/O bus 8 and the multiplexer 7.

As will be understood from the foregoing description, the single error correction in a semiconductor memory device is accomplished by adding to the cell array for information data storage a memory cell block for parity check bits, and by regarding the data stored in one row of memory cells as one Hamming code word. Thus, the syndrome generator plays an important role in error correction. Then, the generation of a parity check matrix to be used in the instant invention is described in brief making reference to FIG. 3.

Figures 3A, 3B, 3C, 3D:
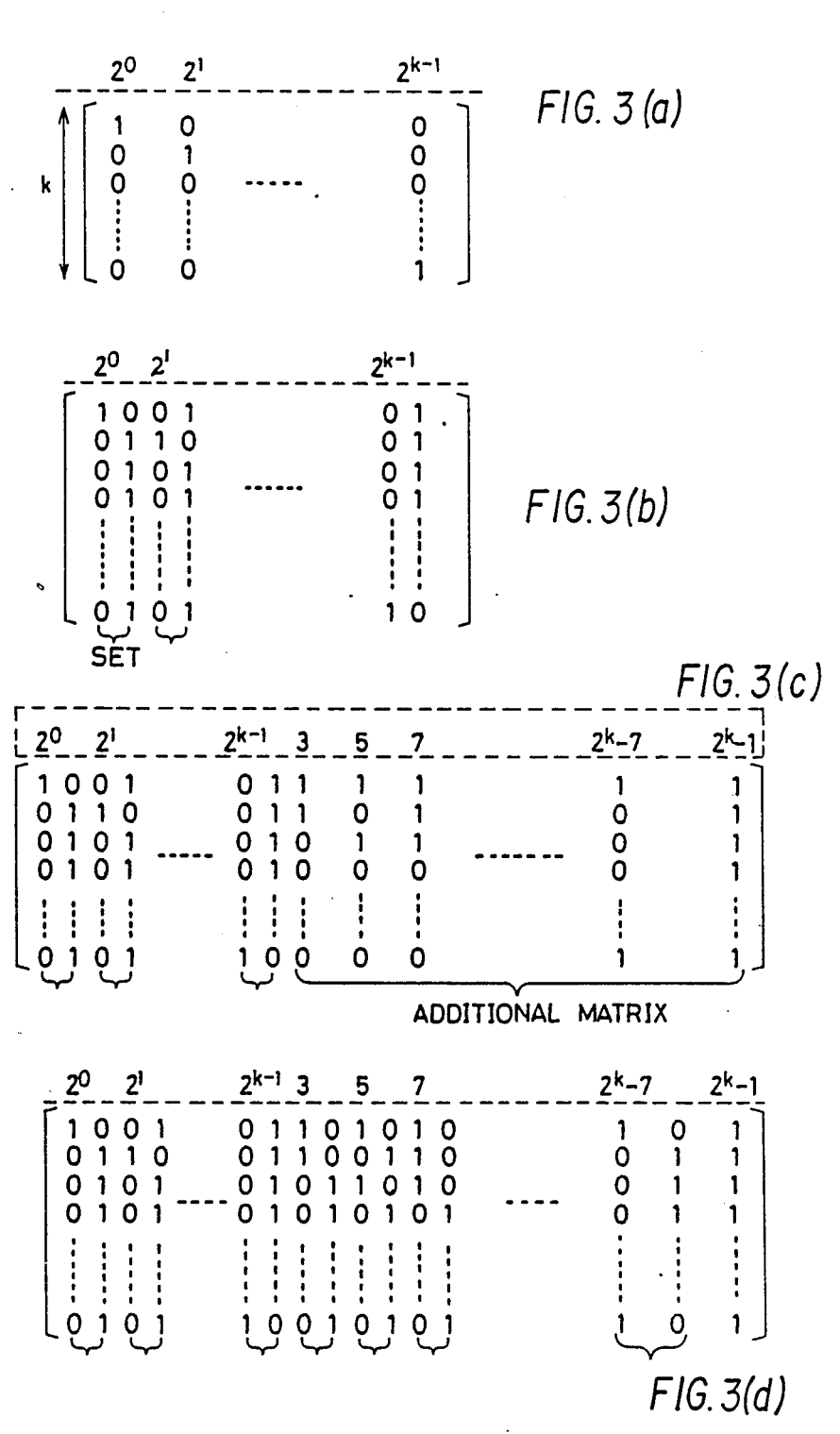

(1) Decimal numbers from $2^0$ to $2^{k-1}$ are represented by k-digit binary numbers, and are arranged in alternate columns of a matrix in a progressively increasing order as shown in FIG. 3(a). Note that the first row is LSB.

(2) In each of the alternate columns of $2^0$-$2^{k-1}$ all of bit values are inverted to obtain a new column vector, and the resultant column vector is then arranged in the right-handly neighboring blank column as shown in FIG. 3(b).

(3) Of the decimal numbers from 1 to $2^k - 1$, odd numbers (i.e. 3, 5, 7, . . . $2^k - 7$, $2^k - 1$) other than the numbers obtained by decimally representing the above 2k column vectors are coded into k-digit binary numbers. The resultant binary numbers are arranged in every other columns of a matrix. The obtained matrix is then added to the existing matrix so that the first column of the additional matrix lies next to the last column of the existing matrix as shown in FIG. 3(c).

(4) As in the step (2), the bit values of the column vector of each alternate column in the newly added matrix are all inverted to obtain a fresh column vector made up of those inverted bits. The column vector of the inverted bits thus obtained is located in a neighboring blank column right-handly next to the referenced column in the alternate columns as shown in FIG. 3(d). Hence, a certain column and its associated neighboring column form a column pair or set. The matrix thus obtained comprises a plurality of column vector pairs.

(5) Next, column vector pairs in the matrix are selected in a number corresponding to the number of the information bits.

(6) Further, column vectors $2^0, 2^1, 2^2, \ldots 2^k$ corresponding to the parity check bits are selected.

A check matrix H is now considered for the Hamming (21, 5) code which comprises five parity check bits and 16 information bits.

As an initial step in the process for generating the desired matrix, column vectors obtained by representing the $2^0, 2^1, 2^2, 2^3, 2^4$ in binary code, which correspond to five parity check bits, are arranged in alternate columns in this order. Then, each of the blank columns right-handly neighboring the above five columns is filled with a column vector made up of a series of row bits obtained by inverting the row elements in the immediately preceding column. This completes a matrix of ten column vectors. Of the decimal numbers from 1 to 31 (=$2^5 - 1$), odd numbers (i.e. *3, 5, 7, 9, 11, 13, 17, 19, 21, 25, 31*) not included in the numbers obtained by representing the aforementioned ten column vectors in decimal notation are coded into binary numbers, and these binary coded numbers are allocated in eleven alternate columns of another matrix. To each of the eleven blank columns right-handly neighboring the alternately arranged columns is allotted a column vector which consists of a series of row bits obtained by inverting the corresponding row bits is the immediately preceding column. However, when the decimal number 31 is coded into a column vector of binary digit and when these binary digits are inverted, they produce a column vector comprising all binary "0"s. Thus, the column vector consisting of only "0"s is ignored or discarded.

In this manner, a parity check matrix H' expressed by the following representation (14) is obtained where all the column vectors have differing values with each other, and there is no likelihood that both the bit in any row of the k-th column vector (where K is an odd number) and the bit in a corresponding row of the (k+1)-th column vector are of binary "1".

$$H' = \begin{pmatrix} 1 & 2 & 4 & 8 & 16 & 3 & 5 & 7 & 9 & 11 & 13 & 17 & 19 & 21 & 25 & 31 \\ & & & & & & .30.29.27.23.15.28.26.24.22.20.18.14.12.10.6 \\ \\ 1001010101101010101010101010101 \\ 0110010101100110011001010001011 \\ 0101100101011010010110010110011 \\ 0101011001010101101010010101101 \\ 0101010110010101010101101010101 \end{pmatrix} \quad (14)$$

Based on the parity check matrix H', a parity check matrix H for the Hamming (21, 5) code having five parity check bits and 16 information bits is generated as follows.

Among the first ten column vectors in the parity check matrix H', five column vectors representing $2^0$, $2^1$, $2^2$, $2^3$, $2^4$ are selected, and they are arranged to form the last five columns in the check matrix H yet to be generated. The portion corresponding to the check bits in the check matrix H forms a diagonal matrix $I_k$. Next, of the remaining 21 column vectors, one column vector binary-representing a decimal number 31 is struck out, leaving 20 column vectors in ten pairs, each pair comprising adjacent two column vectors. Then, eight pairs of column vectors are selected from the above 20 column vectors to form the remaining sixteen columns of vectors in the check matrix H. The resulting check matrix H is expressed by the representation (15). In the matrix H, vector values differ from column to column, and no identical column vectors are found, making it possible for the matrix to perform a single error correction.

$$H = \begin{pmatrix} 101010101010101010000 \\ 100110011001011001000 \\ 011010010110010100100 \\ 010101101010010100010 \\ 010101010101101000001 \end{pmatrix} \quad (15)$$

The syndrome S for the code $X=(x_I, x_C)$ ($x_I$: information bits, $x_C$: parity check bits) is given as:

$$\begin{aligned} S &= HX^T = [P \ I_k] X^T \\ &= PX_I^T \oplus X_C = P(x_1, \ldots x_{16}) + (x_{17}, \ldots x_{21}) \\ &= (SY_0, SY_1, SY_2, SY_3, SY_4) \end{aligned} \quad (16)$$

As is obvious from the equations (15) and (16), in calculating the element $SY_i$ for a syndrome S, either one of the pair of information bits corresponding to the column pair is needed. For example, alternate information bits are employed for $SY_0$. As a result, only one exclusive OR circuit is necessary for two memory cells, relaxing pitch conditions on the exclusive OR circuit.

Figure 4:
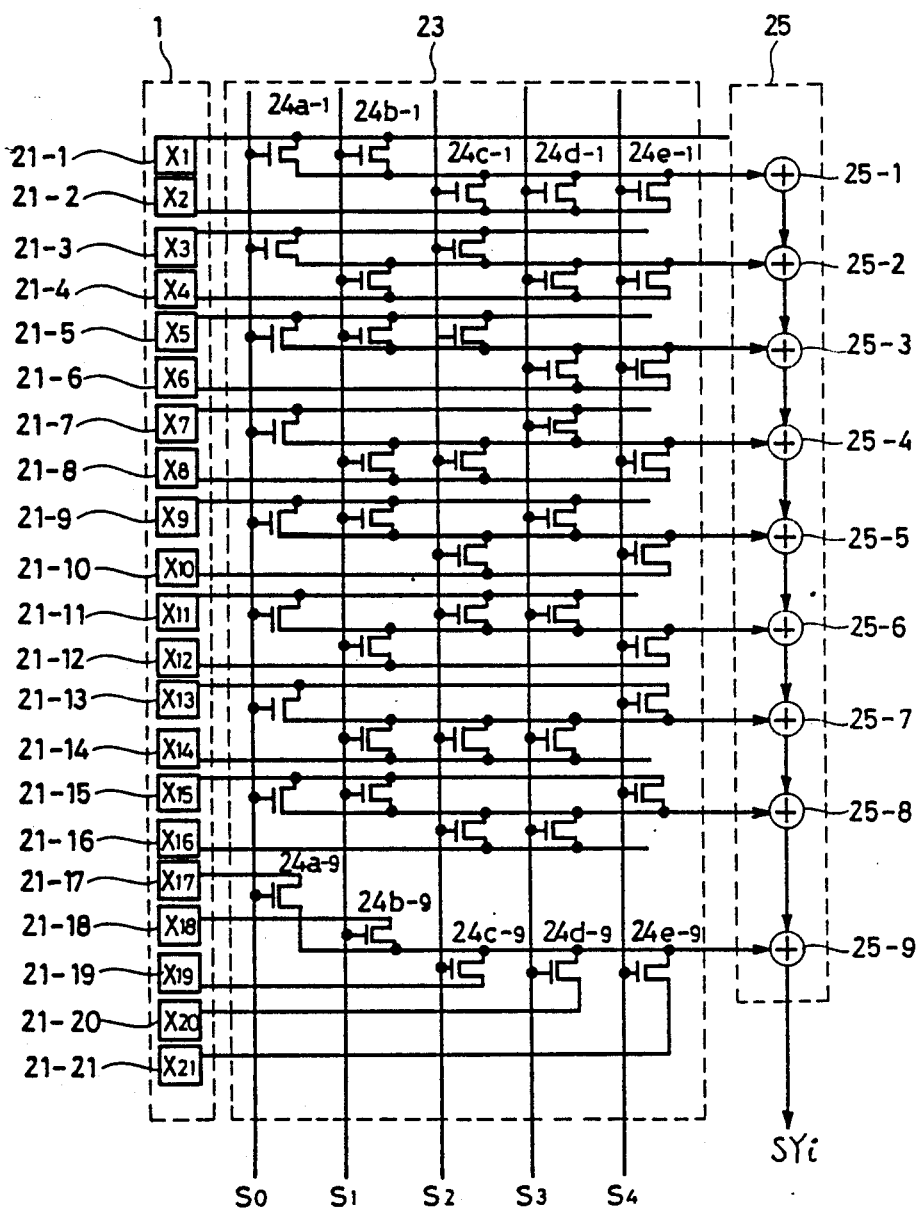
FIG. 4 is a schematic illustration showing the arrangement of a syndrome generator according to one embodiment of this invention.

In FIG. 4, there is illustrated a syndrome generator designed to generate a syndrome using the check matrix H given by the equation (15). As shown, the first to sixteenth memory cells 21-1 to 21-16 are for storing the data of information bits $x_1, x_2, \ldots x_{16}$, while the seventeenth to twenty first memory cells 21-17 to 21-21 are for storing the data of check bits $x_{17}, x_{18}, \ldots x_{21}$. In the selector 23, switching devices or transistors 24a-1 to 24e-9 are connected such that memory cells corresponding to the check matrix H expressed by the equation (15) are selected in response to the $S_0$, $S_1$, $S_2$, $S_3$ and $S_4$. In other words, if the presence of a switching transistor interconnected to a memory cell is defined as a "1", while the absence of such switching transistor as a "0", and if signal lines $S_0$–$S_4$ are associated with corresponding rows of the matrix H, while the output lines of the memory cells with corresponding columns of the matrix H, then, the arrangement of the switching transistors corresponds to that of the components in the matrix H. As can be seen in FIG. 4, one switching transistor coupled to an information memory bit cell is provided for a pair of columns in a row. With the arrangement, in calculating the syndrome, only one of the paired information bit cells is selected by the select signal $SY_i$. When calculating a syndrome element $SY_i$ in the i-th row of the syndrome $HX^T$, the exclusive OR circuit block 25 which receives the data stored in the memory cells to be selected by the selector 23 requires only either of the paired information bits $x_k$ and $x_{k+1}$ (where k is an odd number) in the information bits $x_1$–$x_{16}$. Exclusive OR circuits 25-1 to 25-8 in the block 25 are provided one for each two memory cells in the memory cells 21-1 to 21-16 where the data of the information bits $x_1$–$x_{16}$ are stored. As for the memory cells 21-17 to 21-21 where the data of the check bits $x_{17}$–$x_{21}$ are stored, one exclusive OR circuit 25-9 is assigned to the five memory cells. This is because, the check bits being multiplied by the unit matrix $I_k$, only one parity check bit is necessary for each syndrome element in the calculation of the syndrome.

With the syndrome generator as constructed above, the elements $SY_i$ (i=0, 1, 2, 3, 4) of the syndrome $HX^T = (SY_0, SY_1, SY_2, SY_3, SY_4)^T$ according to the check matrix H represented by the expression (15) are obtainable by activating the select signals $S_i$ (i=0, 1, 2, 3, 4) to a high level potential in sequence. If any of the select signals $S_i$ is activated to a high level potential, the transistors 24 connected to the signal line for the activated signal $S_i$ are rendered conductive, thereby to select the associated memory cells 21. The data stored in the selected memory cells are processed by the exclusive OR circuit block 25. Through the sequential activation of the select signal $S_i$, the syndrome elements in the rows of the syndrome $HX^T$ are successively calculated to provide the syndrome $HX^T$.

Figure 5:
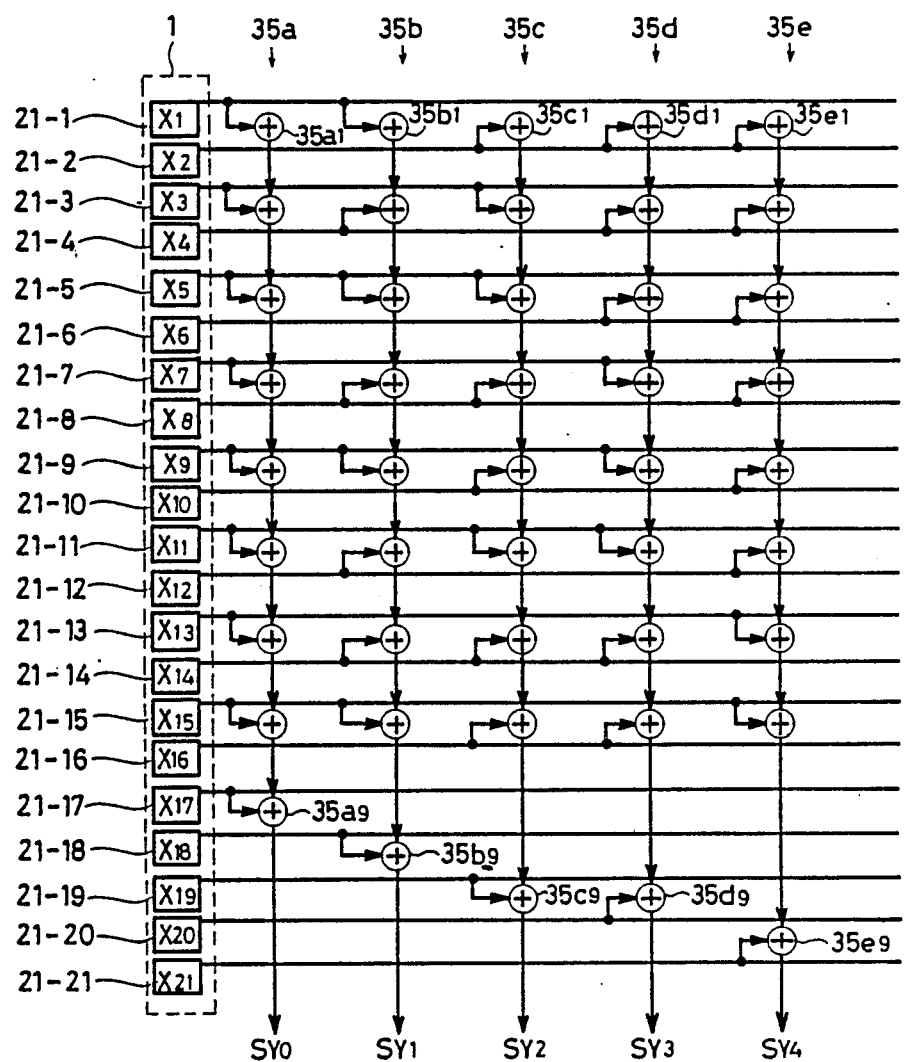
FIG. 5 is a schematic illustration showing an arrangement of a syndrome generator according to another embodiment of the invention.

As discussed in detail hereinabove, the syndrome generator of FIG. 4 is designed to generate the syndrome using the check matrix H expressed by the representation (15). Accordingly, in calculating the syndrome element $SY_i$ in the i-th row of the syndrome $HX^T$, either one of the paired information bits $x_k$ and $x_{k+1}$ (where k is an odd number) in the information bits $x_1$–$x_{16}$ is required. As a consequence, one exclusive OR circuit can be only provided well for the pitch of two memory cells, relaxing the pitch requirements on the exclusive OR circuit. In the syndrome generator of the above illustrated embodiment, the syndrome elements $SY_i$ (i=0–4) of each row in the syndrome $HX^T$ are calculated to be obtained by successively activating the select signals $S_i$ in time division manner through the use of the selector circuit 23. However, the syndrome generator may suitably be designed such that the element $SY_i$ of each row in the syndrome $HX^T$ is simultaneously calculated, as shown in FIG. 5. Thus, in the syndrome generator of FIG. 5, five circuit assemblies 35a, 35b, 35c, 35d and 35e, each comprising a plurality of series connected exclusive OR circuits are provided, each assembly for each syndrome element $SY_i$ (i=0-4). As data are read out from each memory cell 21 in the memory cell array 1, the elements $SY_i$ for each row of the syndrome $HX^T$ are simultaneously obtained through corresponding exclusive OR circuit assemblies 35a–35e.

The arrangement of the syndrome generator shown in FIG. 5 is realized by replacing the switching devices 24a-1 to 24e-9 of FIG. 4 with exclusive OR circuits 35a1-35e1. Thus, in this arrangement, too, the desirable condition of one exclusive OR circuit pitch for two memory cell pitches is retained.

The syndrome generator of the invention has been shown and described as being applied to error correction in the semiconductor memory devices. However, the single error correction of data by means of the Hamming code is also utilized to correct received data stream in data communications. Considering the memory cells 21-1 to 21-21 as data holding resisters for received data stream on the data receiving side, the arrangement of this invention can be applied to circuit devices for generating the syndrome for the Hamming code in various data processing applications.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A generator for generating a syndrome for Hamming (n,k) code by multiplying a check matrix of k rows and n columns with received n bit binary data which belong to said Hamming (n, k) code, comprising:
   storage means for storing said received n bit data; and
   calculating means for multiplying a predetermined check matrix of k rows and n columns with said received n bit binary data from said storage means to provide a syndrome of k bits for said received n bit binary data;
   said predetermined check matrix consisting of n column vectors, wherein each said column vector is a non-zero vector and is different from other column vectors and the dot product of N-th column vector and (N+1)-th column vector in said n column vector is zero where N is an odd integer smaller than (n−1).

2. A generator in accordance with claim 1, wherein said calculating means comprises,
   selector means disposed in a matrix of k rows and n columns corresponding with the bit pattern of said predetermined check matrix for selectively reading out the data in said storage means,
   selecting means, responsive to a row select signal, for selecting one row of said selector means to activate the selector means on said selected one row, and
   operation means for receiving data through said activated selector means to perform an addition of modulus 2 on said received data.

3. A generator in accordance with claim 2, wherein said operation means comprises a plurality of cascade-connected exclusive OR circuits, each provided for every two adjacent columns of said selector means.

4. A generator in accordance with claim 3, wherein said n bit binary data comprise (n-k) information bits and k parity check bits, and said predetermined matrix comprises a unit matrix of k rows and k columns in a position corresponding to said parity check bits, and in said exclusive OR circuits only one exclusive circuit is provided for the columns of the selector means receiving said parity check bits.

5. A generator in accordance with 1, wherein said calculating means comprises a plurality of exclusive OR circuits disposed in a matrix of rows and columns in correspondence with the bit pattern of said predetermined parity check matrix, the exclusive OR circuits on each row are cascade connected, and each exclusive OR circuit in each row is provided so as to receive stored data in said storage means when corresponding bit value in the bit pattern of said parity check matrix is "1".

6. A method for generating a syndrome for Hamming (n,k) code by multiplying a predetermined check matrix of k rows and n columns of binary digits with applied n bit binary data which belong to said Hamming (n, K) code, comprising:
   storage step of for storing said applied n bit binary data; and
   calculating step for reading out said stored n bit binary data and multiplying said predetermined check matrix of k rows and n columns with said read-out n binary bit data stored in said storage step of to provide a syndrome of k bits for said read-out n bit data;
   said predetermined check matrix consisting of n column vectors, wherein each said column vector is non-zero vector and is different from other column vectors and the dot product of N-th column vector and (N+1)-th column vector in said n column vectors is zero where N is an odd integer smaller than (n−1).

* * * * *